US006817405B2

United States Patent
Kamath et al.

(10) Patent No.: US 6,817,405 B2
(45) Date of Patent: Nov. 16, 2004

(54) APPARATUS HAVING FORCED FLUID COOLING AND PIN-FIN HEAT SINK

(75) Inventors: Vinod Kamath, Raleigh, NC (US); Beth Frayne Loebach, Raleigh, NC (US); Jason Aaron Matteson, Cary, NC (US); Mohanlal S. Mansuria, Apex, NC (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/064,000

(22) Filed: Jun. 3, 2002

(65) Prior Publication Data

US 2003/0221814 A1 Dec. 4, 2003

(51) Int. Cl.[7] .................................................. F28F 7/00
(52) U.S. Cl. .................. 165/80.3; 165/80.2; 165/185; 165/908; 257/706; 257/707; 257/712; 257/713; 257/721; 257/722; 361/689; 361/690; 361/692; 361/693; 361/704; 361/707; 361/718; 361/719; 361/722; 174/16.3
(58) Field of Search .......................... 165/80.2, 80.3, 165/185, 908; 174/16.3; 257/706, 707, 712, 713, 721, 722; 361/689, 690, 692, 693, 704, 707, 718, 719, 722

(56) References Cited

U.S. PATENT DOCUMENTS

| 4,292,647 | A | * | 9/1981 | Lee .............................. 257/713 |
| 4,296,455 | A | * | 10/1981 | Leaycraft et al. ........... 361/691 |
| 4,638,858 | A | * | 1/1987 | Chu ........................... 165/185 |
| 4,899,210 | A | * | 2/1990 | Lorenzetti et al. ........... 257/712 |
| 5,113,315 | A | * | 5/1992 | Capp. Michael L. et al. ........................... 361/704 |
| 5,285,350 | A | | 2/1994 | Villaume ..................... 361/690 |
| 5,299,090 | A | * | 3/1994 | Brady et al. ................. 361/703 |
| 5,351,748 | A | * | 10/1994 | Dagan ........................ 165/80.3 |
| 5,369,301 | A | * | 11/1994 | Hayashi et al. ............. 257/722 |
| 5,421,406 | A | | 6/1995 | Furusawa et al. ........... 165/185 |
| 5,447,189 | A | | 9/1995 | McIntyre ........................ 165/1 |
| 5,717,248 | A | * | 2/1998 | Neumann et al. ........... 257/718 |
| 5,737,187 | A | * | 4/1998 | Nguyen et al. ............. 361/704 |
| 5,781,411 | A | * | 7/1998 | Feenstra ..................... 361/704 |
| D398,295 | S | * | 9/1998 | Chang ........................ D13/179 |
| D419,979 | S | * | 2/2000 | Lu et al. ..................... D14/439 |
| 6,021,045 | A | * | 2/2000 | Johnson ..................... 361/704 |
| 6,025,643 | A | * | 2/2000 | Auger ........................ 257/706 |
| 6,093,961 | A | * | 7/2000 | McCullough ............... 257/718 |
| 6,128,188 | A | * | 10/2000 | Hanners ..................... 361/694 |
| 6,244,331 | B1 | * | 6/2001 | Budelman .................. 165/80.3 |
| 6,269,864 | B1 | | 8/2001 | Kabadi ....................... 165/80.3 |
| 6,273,186 | B1 | | 8/2001 | Ognibene et al. ........... 165/185 |
| 6,374,490 | B1 | * | 4/2002 | Miyahara ................. 29/890.03 |
| 6,374,905 | B1 | * | 4/2002 | Tantoush ................... 165/80.3 |

(List continued on next page.)

*Primary Examiner*—Henry Bennett
*Assistant Examiner*—Nihir Patel

(57) ABSTRACT

A heat sink has a base plate and attached pin-fins with intake and discharge openings connected by a tubular channel. A pump moves cooling fluid across the exterior surface of the pin-fins, as well as the interior surface of the tubular channels, thereby increasing the surface area exposed to the cooling fluid. In one embodiment, the cooling fluid moves parallel to the base plate, and the discharge openings are oriented to discharge fluid in the same direction as the pump output, +/−90 degrees. Baffles may be added to duct the cooling fluid over the heat sink. In another embodiment, the cooling fluid moves perpendicular to the base plate and the discharge openings are oriented to vent the cooling fluid along lines that extend outward from a center point of the base plate, or along radial lines drawn from a central point through the pin-fins.

8 Claims, 6 Drawing Sheets

U.S. PATENT DOCUMENTS

| | | | |
|---|---|---|---|
| 6,424,530 B1 * | 7/2002 | Lee et al. | 361/704 |
| 6,478,082 B1 * | 11/2002 | Li | 165/185 |
| 6,489,005 B1 * | 12/2002 | Armacost et al. | 428/119 |
| 6,508,595 B1 * | 1/2003 | Chan et al. | 385/92 |
| 6,591,897 B1 * | 7/2003 | Bhatti et al. | 165/80.3 |
| 6,666,260 B2 * | 12/2003 | Tantoush | 165/80.3 |
| 6,741,470 B2 * | 5/2004 | Isenburg | 361/704 |
| 2001/0027855 A1 | 10/2001 | Budelman | 165/80.3 |

* cited by examiner

US 6,817,405 B2

APPARATUS HAVING FORCED FLUID COOLING AND PIN-FIN HEAT SINK

BACKGROUND OF INVENTION

This invention pertains to computer systems, electronic systems and other electrical apparatus, and any other apparatus that includes a heat producing device that requires cooling. More particularly, this invention pertains to an apparatus having a cooling system that uses forced air or other cooling fluid, and a tubular pin-fin heat sink in which the cooling fluid is forced over both the outside and the interior surfaces of the tubular pin-fins.

While the recent increase in the speed of microprocessors has significantly increased the processing capability of computers, this increase in speed has resulted in additional heat generation that must be dissipated. Typically, a heat sink is thermally attached to the integrated circuit package containing the microprocessor or other chip, and a cooling fan is used to force air over the heat sink. To improve the heat dissipation capability of the heat sink, the surface area of the fins can be increased, but this usually comes with a penalty of an increase in the pressure drop of the air flow across the heat sink, as well as large thermal boundary layers that inhibit the heat transfer rate and total heat flux from the source.

The invention described below enhances the flow of air or other cooling fluid through the heat sink, thereby decreasing the pressure drop across the heat sink, while providing an increase in the surface area of the heat sink available for heat transfer. This increase in surface area is approximately 20–30% greater than a conventional heat sink, resulting is a corresponding increase in cooling efficiency.

SUMMARY OF INVENTION

Briefly, the invention is an apparatus including a heat generating component and a heat conducting base plate thermally coupled to the heat generating component. A plurality of heat conducting, pin-fins, each having a free end and an attachment end, are attached to the base plate at the attachment end. Each of the pin-fins has an intake opening wherein the intake opening is oriented to admit cooling fluid moving in a first direction substantially parallel to the base plate. Each of the pin-fins also has a discharge opening for discharging cooling fluid. A tubular channel extends from the intake opening to the discharge opening of each of the pin-fins. A pump system is provided for moving cooling fluid in the first direction substantially parallel to the base plate such that cooling fluid moves over the exterior surface and through the tubular channel of each of the pin-fins.

In another embodiment, the invention is a heat sink including a heat conducting base plate and a plurality of heat conducting, pin-fins. Each of the pin-fins has a free end and an attachment end, and the attachment end of each of the pin-fins is attached to the base plate. Each of the pin-fins has an intake opening wherein the intake opening is oriented to admit cooling fluid moving in a first direction substantially parallel to said base plate. Each of the pin-fins also has a discharge opening for discharging cooling fluid. A tubular channel extends from the intake opening to the discharge opening of each of the pin-fins.

In another embodiment, the invention is an apparatus including a heat generating component and a heat conducting base plate thermally coupled to the heat generating component. A plurality of heat conducting, pin-fins, each of the pin-fins having a free end and an attachment end, are attached to the base plate at the attachment end. Each of the pin-fins has an intake opening adjacent the free end wherein the intake opening is oriented to admit cooling fluid moving in a direction substantially perpendicular to the base plate. Each of the pin-fins also has a discharge opening adjacent the attachment end for discharging cooling fluid. A tubular channel extends from the intake opening to the discharge opening through each of the pin-fins. A pump system is provided for moving cooling fluid in a direction substantially perpendicular to said base plate, such that cooling fluid moves over the exterior surface and through the tubular channel of each of the pin-fins.

In yet another embodiment, the invention is a heat sink including a heat conducting base plate and a plurality of heat conducting, pin-fins having a free end and an attachment end. The pin-fins are attached to the base plate at the attachment end. Each of the pin-fins has an intake opening adjacent the free end wherein the intake opening is oriented to admit cooling fluid moving in a direction substantially perpendicular to the base plate. Each of the pin-fins also has a discharge opening adjacent the attachment end for discharging cooling fluid. A tubular channel extends from the intake opening to the discharge opening of each of the pin-fins. The discharge opening of each of said pin-fins is oriented to discharge cooling fluid in a general direction away from a point substantially in the center of the base plate.

DETAILED DESCRIPTION

While the invention is illustrated below with respect to a semiconductor microprocessor as a heat generating device, it should be understood that the invention can be used to cool other types of semiconductor chips and electronic or electrical devices, as well as any other heat producing device. Similarly, the invention is illustrated below having a fan to move air as a cooling fluid over the heat sink, but the invention may also be practiced with other well known cooling fluids and fluid pumps.

Parallel Flow Embodiment

Figure 1:
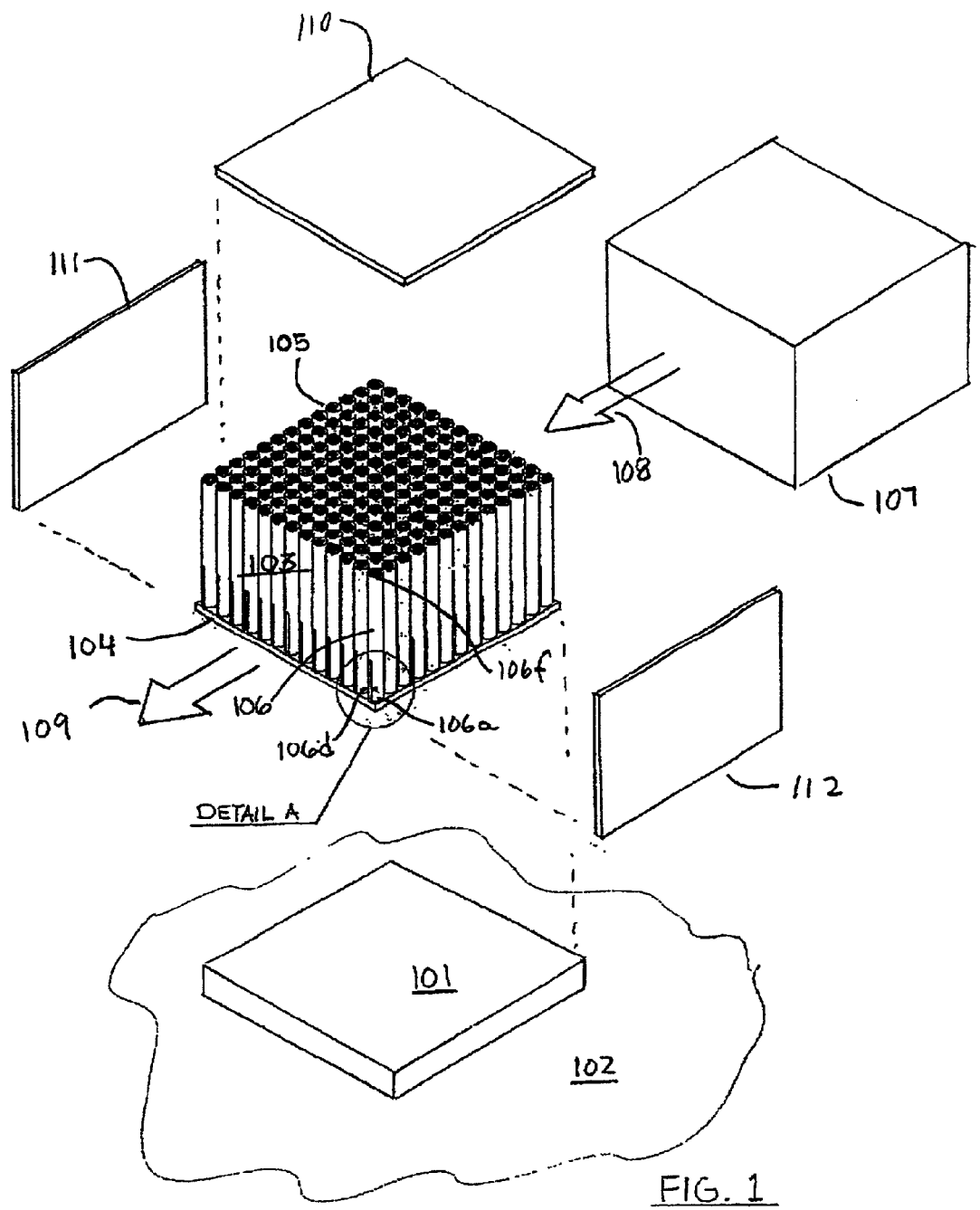
FIG. 1 is an exploded perspective view of a computer system having a heat generating microprocessor cooled by a pin-fin heat sink and fan of first embodiment of the present invention, wherein air flow is substantially parallel to the base plate of the heat sink.
Figure 2:
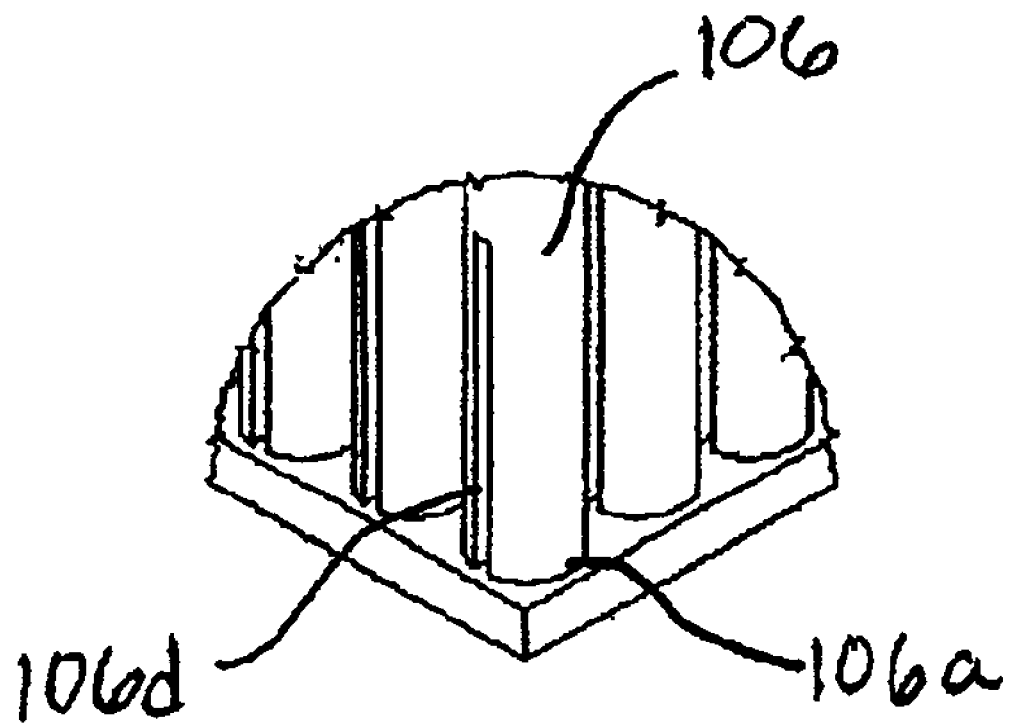
FIG. 2 is a perspective view of Detail A of FIG. 1 illustrating several slit openings in the pin-fins.
Figure 3:
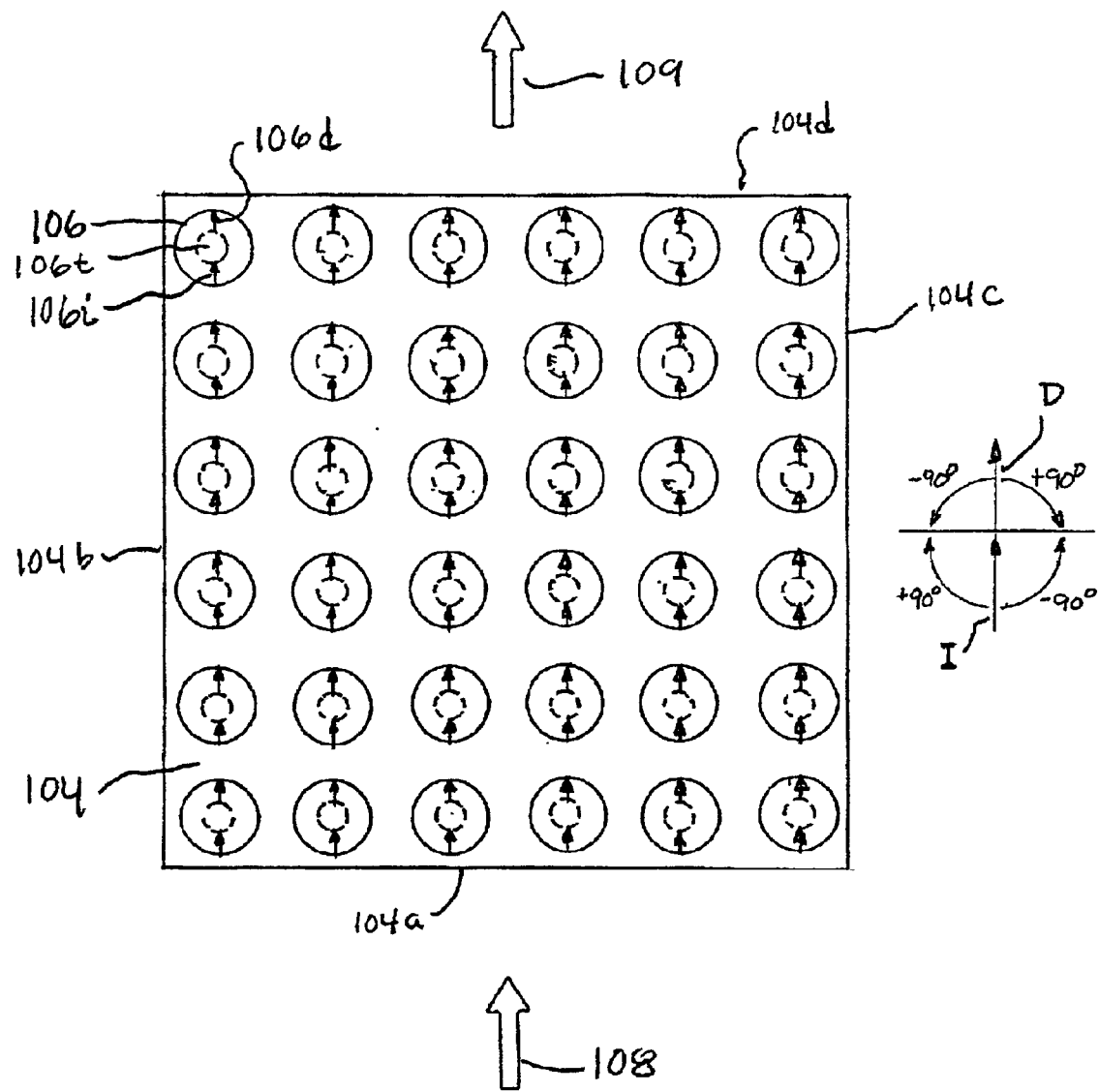
FIG. 3 is a top plan view of the heat sink of FIG. 1 illustrating the orientation of the intake and discharge openings of the pin-fins.

FIGS. 1-3 illustrate of one embodiment of the current invention in which the general flow of the cooling fluid is substantially parallel to the base plate of the heat sink. Referring to FIG. 1, a microprocessor 101 is attached to a printed circuit board 102 or other well known substrate. A heat sink 103 includes a thermally conducting base plate 104, which is preferably made from aluminum or copper. Base plate 104 may also be a well known vapor chamber, or a well known thermally conductive composite material. Base plate 104 is thermally attached to microprocessor 101, which attachment may a direct attachment in which the bottom surface of the base plate is directly in contact with the semiconductor package containing the microprocessor chip, or may include a well know thermally conducting grease. Other well known methods and devices for coupling base plate 104 to microprocessor 101 such that heat flows from the microprocessor into the base plate may also be used.

A plurality of tubular pin-fins 105, such as pin-fin 106, each include an attachment end and a free end, such as attachment end 106a and free end 106f of pin-fin 106. Pin-fins 105 are preferably made from aluminum or copper, but other heat conducting materials may also be used. Each pin-fin 105 may include a hollow tubular core, such as tube 106t as visible in phantom line in FIG. 3, through which cooling fluid flows. An intake and discharge opening, such as intake opening 106i and discharge opening 106d, admit and discharge cooling fluid, respectively (intake opening 106i is not visible in FIG. 1, but is illustrated in FIG. 3). Hollow tubular core 106t connects intake opening 106i to discharge 106d, channeling cooling fluid between the two openings. While it is preferred that all pin-fins include the hollow tubular core, the invention may also be practiced with less than all pin-fins having these features.

The openings, such as discharge opening 106d (which can also be seen in greater detail in FIG. 2) or intake opening 106i, are preferably slits that extend into the hollow tubular core of the pin-fins. As illustrated in the detailed perspective drawing of FIG. 2, for the opening near base plate 105, the slit preferably begins at or near the base plate are extends towards the free end, such as free end 106f. The length of the slit is preferably h/4 to h/2, wherein h is the height of the pin-fin, although other dimension may be suitable. It should be understood that while the discharge openings, such as opening 106d, are illustrated adjacent base plate 104, and the intake openings are illustrated adjacent free end 106f, it is possible to practice the invention with the discharge openings adjacent the free end of pin-fins 105, and the intake openings adjacent the base plate.

The pin-fins 105 may be attached to base plate 105 using one of several techniques. If mass production is desired, a compression technique may be used in which the attachment ends of the pin-fins are inserted into stamped grooves in the base plate, and the edges of the base plate are then compressed along the planar axis of the base plate using a high impact force to crimp the pin-fins in place. If pin-fins 105 are made from aluminum or copper, they may also be soldered to base plate 104 using a well know tin/lead or lead free solder. In pin-fins 105 are aluminum, nickel coating is desirable prior to soldering. Other techniques for attaching fins to a base plate may also be used.

A typical diameter for a pin-fin 105 is 1 mm to 2.5., with a wall thickness of 0.4 to 0.6 mm. The spacing between adjacent pin-fins 105 is typically 0.4 to 2.0 times the pin-fin diameter. It should be noted that while pin-fins 105 are illustrated as being cylindrical in shape, and that the preferred shape of the hollow tubular core is cylindrical, the invention may be practiced with other cross sectional shapes, such as square, rectangular or elliptical. In general, the density of pin-fins 105 can be increased as the power of the fluid pump is increased.

A fan or other fluid pump 107 is positioned to blow air or other cooling fluid over heat sink 103 in a direction parallel to base plate 104 as indicated by intake arrow 108 and discharge arrow 109. Baffles 110, 111 and 112 may be used to duct the cooling fluid over heat sink 103 and improve the efficiency of the system. When air is used as a cooling fluid, a better fan system will produce a pressure of 5 inches of water on the intake side, although the invention may be practiced with a pumping system that produces more or less pressure.

FIG. 3 is a top plan view of heat sink 103 of FIG. 1 and, in particular, illustrates the orientation of the intake and discharge openings of this embodiment. Referring to this figure, it can be seen that the intake openings, which are indicated schematically with an arrow facing in towards the hollow tubular core such as 106t, are in the same direction 108 as the output of the fan or other fluid pump. Similarly, the discharge openings, such as 106d, are also aligned along direction 108. However, as is illustrated schematically in FIG. 3, the orientation of the discharge opening "D" can be the same as direction 108, plus or minus 90 degrees. Similarly, the orientation of the intake openings I can be direction 108 plus or minus 90 degrees. Thus, it is not necessary for each and every discharge opening to be aligned with direction 108, and the orientation of each of the discharge openings can be adjusted within +/−90 degrees to produce the least resistance of fluid flow through the heat sink.

In addition, and particularly useful when one or more baffles are employed to duct the cooling fluid through the system, the heat sink can be designed to discharge the cooling fluid in a direction 90 degrees to direction 108. In this embodiment of the invention, baffles 110 and 111 would be used as illustrated in FIG. 1, and baffle 112 would also be used, but positioned along edge 104d of the heat sink (i.e., on the opposite side of the heat sink from fan 107), such that the cooling fluid would be discharged adjacent edge 104b of the heat sink. In this embodiment, the discharge openings of pin-fins 105 would preferably be varied in orientation, with the discharge openings of the first row of pin-fins adjacent edge 104a being oriented substantially parallel to direction 108, and the discharge openings of subsequent rows of pin-fins gradually sweeping to the left until the discharge openings in the back row of pin-fins (the row adjacent edge 104d) are all oriented −90 degrees from direction 108 (i.e., pointing to the left in FIG. 3).

In operation, fan 107 or other fluid pump moves cooling fluid in direction 108 over the exterior surfaces of pin-fins 105 and, also, into the intake openings (such as 106i), through the hollow tubular channels (such as 106t) and out the discharge openings (such as 106d). It is the additional surface area of the interior walls of the tubular channels that provide increased cooling when compared to a prior art heat sink, as well as the orientation of the intake and discharge openings which decrease the resistance to the flow of cooling fluid through the heat sink system, thereby increasing flow rate.

Impingement Flow Embodiment

Figure 4:
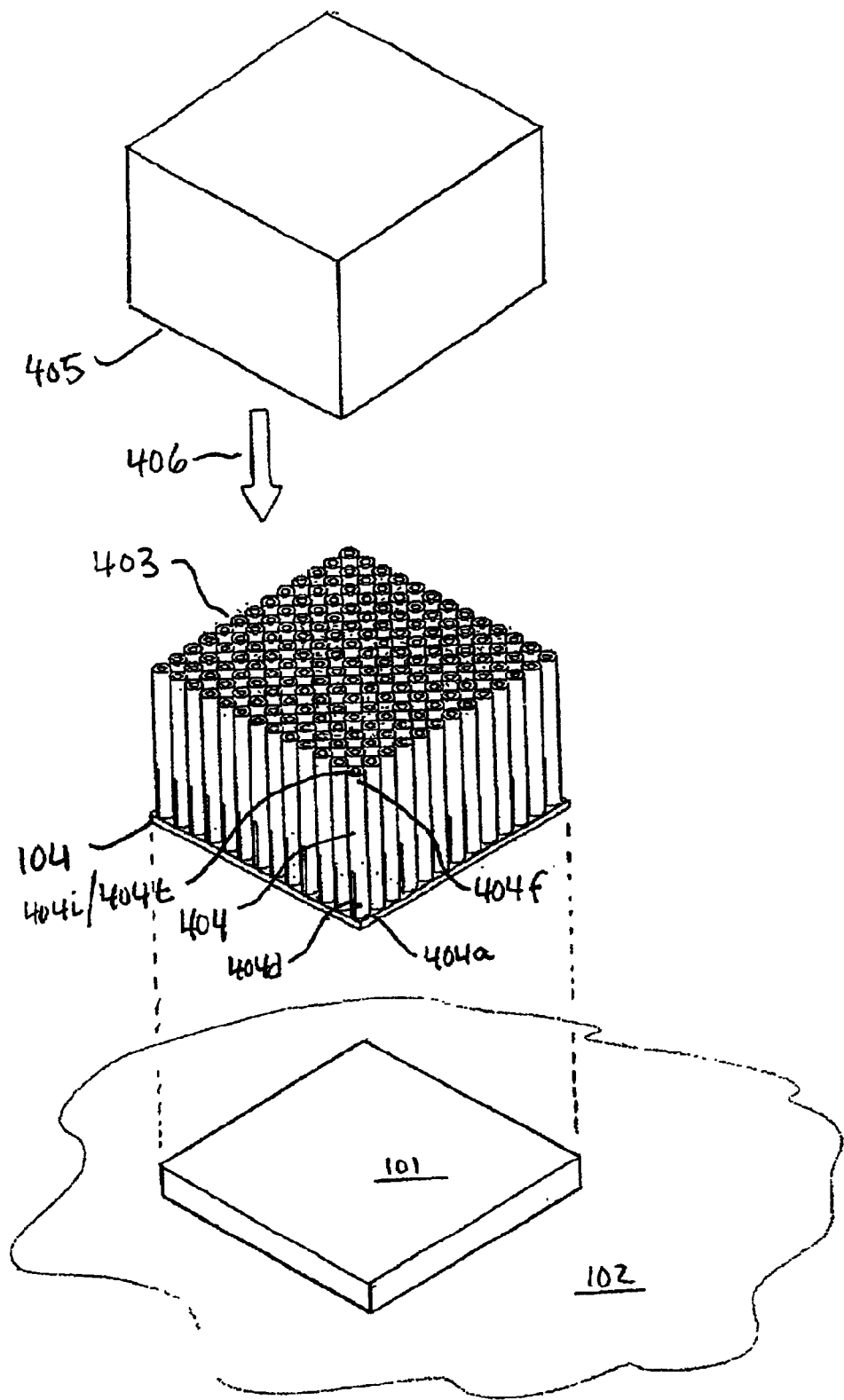
FIG. 4 is an exploded perspective view of a computer system having a heat generating microprocessor cooled by a pin-fin heat sink and fan of another embodiment of the present invention, wherein air flow is substantially perpendicular to and impinging upon the base plate of the heat sink.
Figure 5:
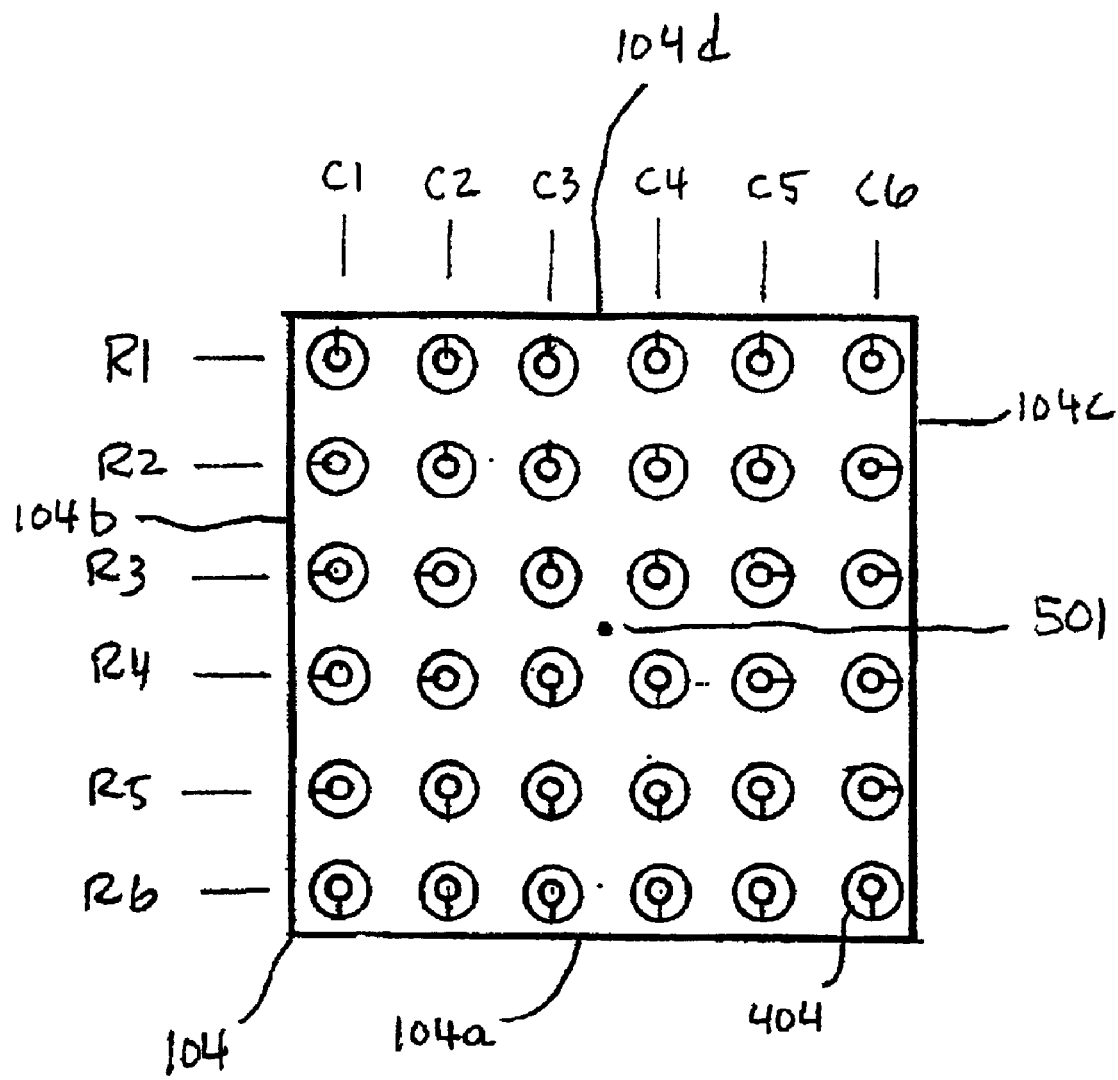
FIG. 5 is a top plan view of the heat sink of FIG. 4 in which the discharge openings are oriented to discharge cooling fluid in a general direction away from a point substantially in the center of the base plate.
Figure 6:
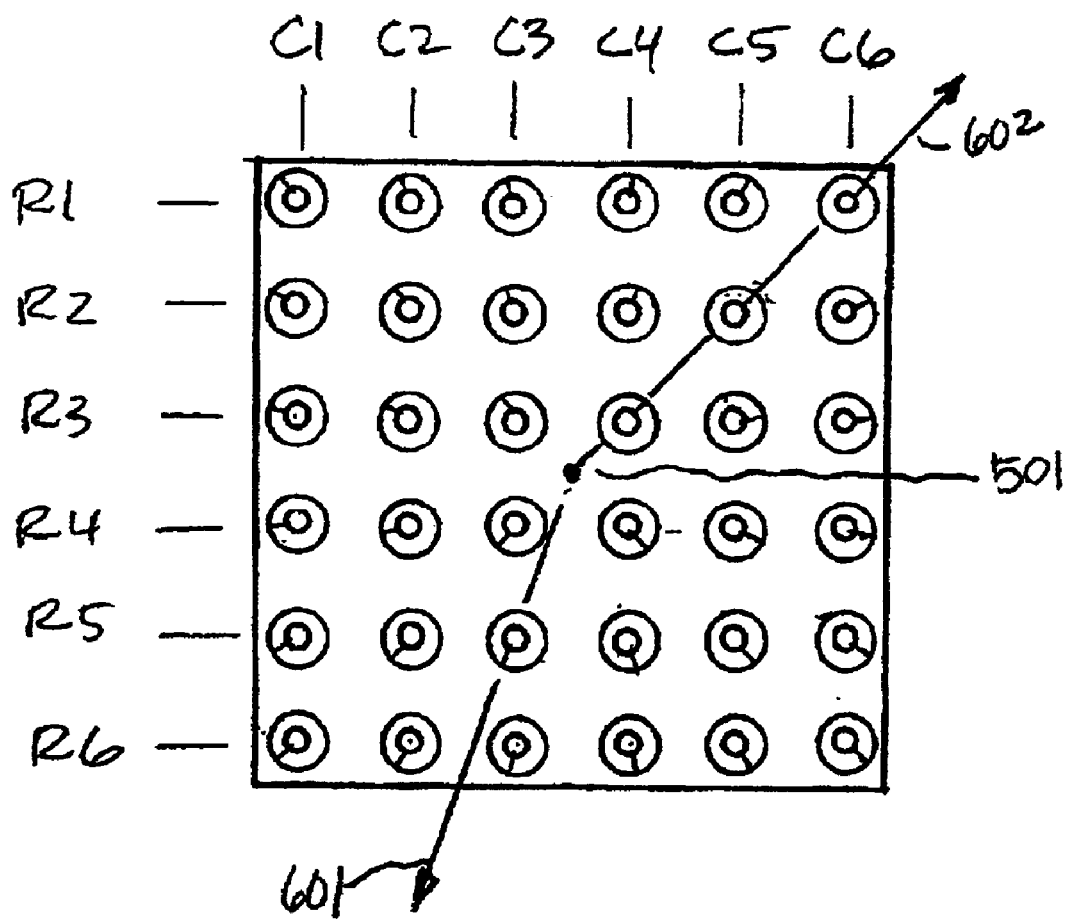
FIG. 6 is a top plan view of the heat sink of FIG. 4 in which the discharge openings are oriented to discharge cooling fluid in a general direction along a radial line drawn from a point substantially in the center of the base plate and extending out through the pin-fin.

FIGS. 4-6 illustrate another embodiment of the current invention in which the general flow of the cooling fluid is substantially perpendicular to the base plate of the heat sink; i.e., impinging upon the base plate. It is preferred that this embodiment be ductless; i.e., without baffles such as baffles 110–112, although baffles may be employed.

Referring to FIG. 4, microprocessor 101, circuit board 102 and base plate 104 are similar to the ones described above with respect to FIG. 1. Fan or pump 405 is also similar to fan or pump 107, except that fan 405 discharges its cooling fluid down towards base plate 104. Pin-fins 403 are also similar to pin-fins 105, except that pin-fins 403 have their intake openings, such as intake opening 404i, at the top of the pin-fins as illustrated in FIG. 4., such that these intake openings are oriented to admit cooling fluid moving in direction 406; i.e., perpendicular and impinging upon base plate 104.

While the orientation of the discharge openings may be the same as illustrated in FIG. 3, it is preferred that these openings be oriented as illustrated in FIG. 5 or 6. These orientations of discharge openings help reduce the resistance of fluid flow through the heat sink system, thereby increasing the flow of cooling fluid through the system.

FIG. 5 illustrates one orientation of the discharge openings, which may be slits as described above. Reference to individual pin-fins is by row (R1–R6) and column (C1–C6) number. Point 501 is substantially in the center of base plate 104. In FIG. 5, the discharge openings are oriented to discharge the cooling fluid away from point 501 and, in general, towards the nearest edge 104a-104d of the base plate. For example, pin-fins R1C1–R1C6, R2C2–R2C5 and R3C3–R3C4 are all oriented to discharge fluid towards edge 104d. Similarly, pin-fins R6C1–R6C6, R5C2–R5C5 and R4C3–R4C4 are oriented to discharge cooling fluid towards edge 104a. And pin-fins R3C1–R3C2 and R4C1–R4C2 are oriented to discharge cooling fluid towards edge 104b. Similarly, pin-fins R3C5–R3C6 and R4C5–R4C6 are oriented to discharge towards edge 104c. Note that some pin-fins, such as R2C5, are equidistant between two edges and that one edge (edge 104d, in this example) is arbitrarily chosen as the closest edge.

FIG. 6 illustrates another embodiment in which the discharge openings are oriented along radial lines drawn out from center point 501 and through the individual pin fins. For example, imaginary radial line 601 starts at center point 501 and extends out through pin-fin R5C3, and the discharge opening of pin-fin R5C3 is aligned with this radial line. Similarly, radial line 602 starts at center point 501 and extends out through pin-fins R3C4, R2C5 and R1 C6, and the discharge openings of each of these pin-fins are in alignment with this radial line.

What is claimed is:

1. An apparatus, comprising:

a heat generating component;

a heat conducting base plate thermally coupled to said heat generating component;

a plurality of heat conducting pin-fins, each of said pin-fins having a free end and an attachment end, the attachment end of each of said pin-fins being attached to said base plate, each of said pin-fins having an intake opening wherein the intake opening is oriented to admit cooling fluid moving in a first direction substantially parallel to said base plate, each of said pin-fins having a discharge opening for discharging cooling fluid, each of said pin-fins having a tubular channel extending from the intake opening to the discharge opening, wherein the discharge opening of each said pin-fins is oriented to discharge cooling fluid in the first direction, +/–90 degrees; and a pump system for moving cooling fluid in the first direction substantially parallel to said base plate such that cooling fluid moves over the exterior surface and through the tubular channel of each of said pin-fins.

2. The apparatus of claim 1, further comprising a baffle adjacent the free end of each of said pin-fins and substantially parallel to said base plate for ducting cooling fluid between said base plate and said baffle.

3. The apparatus of claim 1, further comprising a ducting system comprising:

a first baffle adjacent the free end of each of said pin-fins and substantially parallel to said base plate; and a second and third baffles positioned substantially parallel to the first direction and substantially perpendicular to said first baffle;

wherein cooling fluid from said pump system is ducted between said first, second and third baffles and discharged from said ducting system in substantially the first direction.

4. The apparatus of claim 1, further comprising a baffle adjacent the free end of each of said pin-fins and substantially parallel to said base plate for ducting cooling fluid between said base plate and said baffle.

5. The apparatus of claim 1, further comprising a ducting system comprising:

a first baffle adjacent the free end of each of said pin-fins and substantially parallel to said base plate; and a second and third baffles positioned substantially parallel to the first direction and substantially perpendicular to said first baffle;

wherein cooling fluid from said pump system is ducted between said first, second and third baffles and discharged from said ducting system in substantially the first direction.

6. A heat sink, comprising:

a heat conducting base plate;

a plurality of heat conducting pin-fins, each of said pin-fins having a free end and an attachment end, the attachment end of each of said pin-fins being attached to said base plate, each of said pin-fins having an intake opening wherein the intake opening is oriented to admit cooling fluid moving in a first direction substantially parallel to said base plate, each of said pin-fins having a discharge opening for discharging cooling fluid, each of said pin-fins having a tubular channel extending from the intake opening to the discharge opening, wherein the discharge opening of each of said pin-fins is oriented to discharge cooling fluid in the first direction, +/–90 degrees.

7. The heat sink of claim 6, further comprising a baffle adjacent the free end of each of said pin-fins and substantially parallel to said base plate for ducting cooling fluid between said base plate and said baffle.

8. The heat sink of claim 6, further comprising a ducting system comprising:

a first baffle adjacent the free end of each of said pin-fins and substantially parallel to said base plate; and a second and third baffles positioned substantially parallel to the first direction and substantially perpendicular to said first baffle;

wherein cooling fluid is ducted between said first, second and third baffles and discharged from said heat sink in substantially the first direction.

* * * * *